United States Patent
Ito et al.

(10) Patent No.: US 6,359,286 B1
(45) Date of Patent: Mar. 19, 2002

(54) METHOD AND APPARATUS FOR NEUTRALIZING SPACE CHARGE IN AN ION BEAM

(75) Inventors: Hiroyuki Ito, Tochigi (JP); Stephen Moffatt, Surrey (GB)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/462,162
(22) PCT Filed: Jul. 10, 1998
(86) PCT No.: PCT/GB98/02032
  § 371 Date: Mar. 9, 2000
  § 102(e) Date: Mar. 9, 2000
(87) PCT Pub. No.: WO99/03125
  PCT Pub. Date: Jan. 21, 1999
(51) Int. Cl.[7] ................................................. G21K 5/10
(52) U.S. Cl. ................................................. 250/492.21
(58) Field of Search ........................... 250/492.21, 424, 250/251, 398; 204/192 R, 192 E, 198, 298

(56) References Cited

U.S. PATENT DOCUMENTS 4,419,203 A * 12/1983 Harper et al. ............ 204/192 R
5,397,901 A * 3/1995 Lo .............................. 250/424
5,576,538 A 11/1996 Sakai et al.
5,883,391 A * 3/1999 Adibi et al. ............ 250/492.21
5,932,882 A * 8/1999 England et al. ........ 250/492.21
5,969,366 A * 10/1999 England et al. ........ 250/492.21
6,100,536 A * 8/2000 Ito et al. ................. 250/492.21

FOREIGN PATENT DOCUMENTS

| EP | 0475199 A2 | 3/1992 |
| EP | 0774769 A1 | 5/1997 |
| JP | 6325722 | 11/1994 |

OTHER PUBLICATIONS

Japanese Abstract of 1–67854 (A) dated Mar. 14, 1989.

* cited by examiner

Primary Examiner—Jack Berman
Assistant Examiner—Johnnie L Smith, II
(74) Attorney, Agent, or Firm—Boult Wade Tennant

(57) ABSTRACT

Space charge effects in an ion implanter can be caused by the mutual repulsion of ions of a particular polarity in a beam of ions which tend to cause the beam to "blow up" and become uncontrollable. This occurs for example in the ion implanter along the path of the ion beam and in particular at regions of external electric field. Introducing into the ion beam a second polarity of ions space charge neutralises the ion beam.

12 Claims, 1 Drawing Sheet

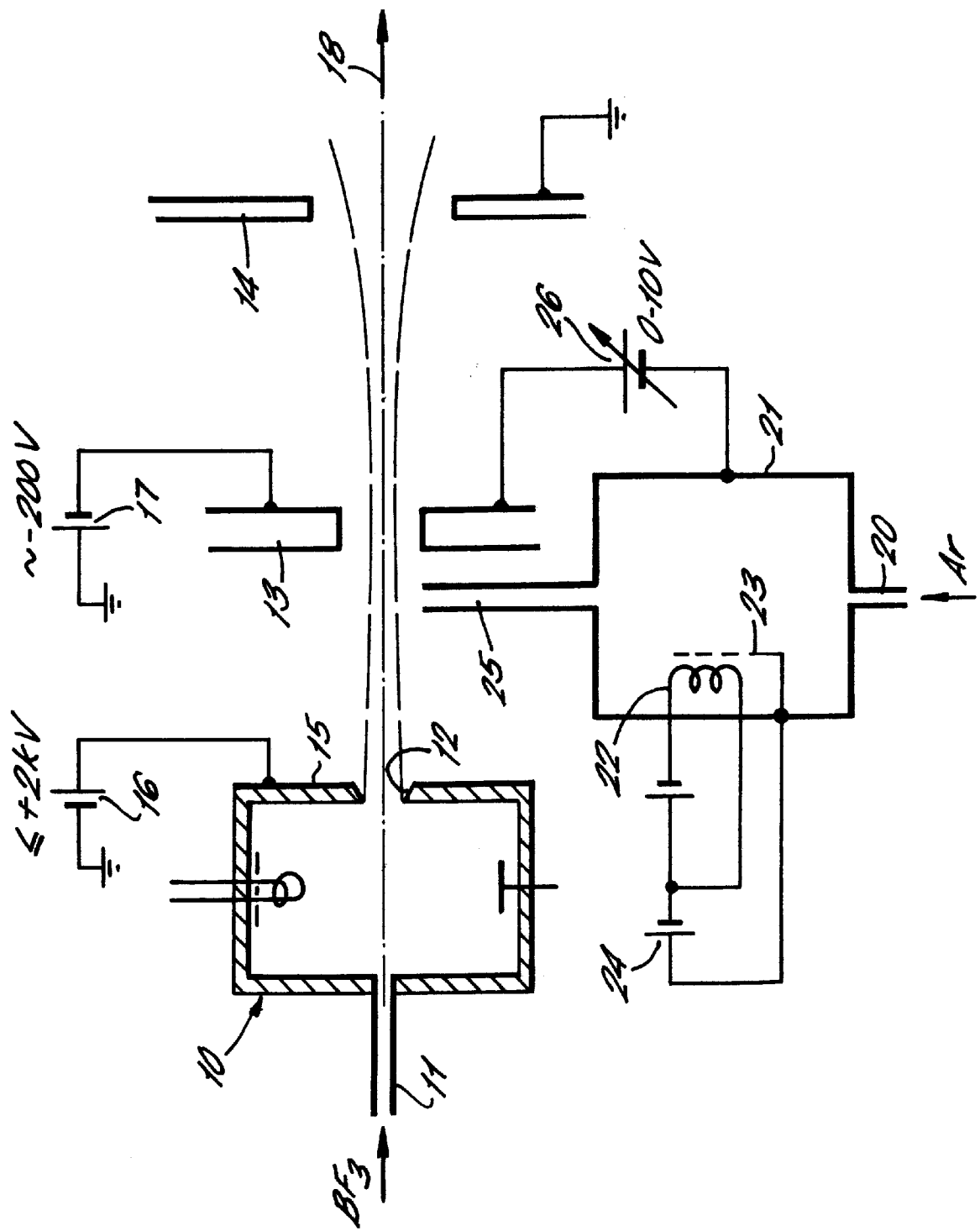

METHOD AND APPARATUS FOR NEUTRALIZING SPACE CHARGE IN AN ION BEAM

This application is the national phase under 35 U.S.C. §371 of PCT International Application No. PCT/GB98/02032 which has an International filing date of Jul. 10, 1997 which designated the United States of America.

The present invention is concerned with neutralising space charge in ion beams.

Ion beams may be used for a number of purposes. In particular, ions of desired dopant species can be implanted in semiconductor substrates. So called "ion implanters" produce a beam of ions of the required dopant species which is directed at the substrate to implant the ions into the semiconductor material.

In the absence of any neutralising effect, a beam containing only ions of a particular polarity will is experience space charge effects. The mutual repulsion of the ions in the beam tends to cause the beam to "blow up" and become uncontrollable. In regions of zero electric field, self neutralisation of ion beams tends to occur, through the production of electrons resulting from collisions between beam ions and slow moving atoms of residual gas in the vacuum chamber through which the beam is passing. However, in regions of electric field, for example when the ions of the beam are being accelerated or decelerated, or the beam is being electrostatically deflected, neutralising electrons are quickly removed from the beam because of their high mobility.

It is therefore a problem to control ion beams and prevent beam blow up, especially in regions containing an external electric field. The effect of beam space charge is especially severe for relatively low energy beams, since for the same beam current, there is a higher density of ions in a low energy beam.

In machines, such as ion implanters, where it is required to present a beam having a predetermined energy onto a target, particular problems arise where the ion beam is first extracted from the ion source, and elsewhere over the beam path where the beam energy is changed, particularly where the beam is decelerated prior to hitting the target. In the case of extraction of ions from an ion source, the need to obtain a usefully high beam current limits the minimum energy at which ions can be extracted from the arc chamber of the source. The region between the exit window of the source arc chamber and the extraction electrode is a region of substantial electric field in which electrons cannot exist for significant times. In the extreme, for high currents and low extraction energies, the theoretical density of ions in the beam leaving the source produces a beam potential similar to the potential on the extraction electrode. Clearly in such a case, the ions in the beam will not experience the required accelerating field and no beam is in fact produced. In fact, space charge effects can severely reduce the extraction efficiency from ion sources at low extraction energies.

In ion implanters, it has therefore been the usual practice to extract ions from the ion source at no less than a minimum extraction energy, typically not less than 10 keV, and for good efficiency often at higher energies. In order to present a beam of lower energy onto the target substrate, the beam must be subsequently decelerated, and space charge problems then arise also in the region of the decelerating field.

There is accordingly a requirement for some mechanism for the efficient extraction of ions from an ion source at relatively low energies, and more generally for arrangements for controlling and neutralising space charge effects in ion beams, especially in regions of externally applied electric field.

According to the present invention, a method of neutralising space charge in an ion beam comprising ions of a first polarity, comprises the steps of generating ions of a second polarity, and introducing said second polarity ions to space charge neutralise the ion beam.

The ions of second polarity should be ions of species which can be tolerated in the ion beam process. For example in an ion implantation process the ions may be of atoms such as He, Ne, Ar, Kr or Xe, or of molecules such as $N_2$, $CO_2$, $CO_2$, CO, $O_2$, $Cl_2$, $Br_2$, $I_2$. In each instance, the selection of an appropriate species is dependent on the need to avoid unwanted reactions and effects in the beam process. For example $O_2$ would not be suitable for neutralising an ion beam being extracted from an ion source employing a hot cathode, such as a Bernas source, as the $O_2$ would quickly corrode the cathode. However $O_2$ may be tolerated with R.F. or microwave energised ion sources.

For effective space charge neutralisation, the density of ions of the first polarity in a region of the ion beam should equal the density of charged particles of the opposite polarity, assuming both the ions and particles are singly charged. However, the density of charged particles in a beam is proportional to the current density of those particles in the beam and inversely proportional to the velocity of the particles in the beam direction. The velocity of charged particles, on the other hand, is proportional to the square root of the energy of the particles and inversely proportional to the square root of the mass of the particles.

The overall effect is that singly charged particles of high mass will have much lower velocities, for the same energy, than lighter particles and especially when compared with electrons. Thus, beam space charge can be effectively neutralised with opposite polarity ions in regions of the beam where neutralisation by electrons may not be possible.

In order to reduce the current density of the second polarity ions in the beam, in a region of applied electric field, required to maintain neutralisation, the mass of the second polarity ions should be as high as possible. Large molecules, including organic molecules may then be useful, such as $B_{10}H_{12}$, $C_xH_y$ (hydro-carbons) or $C_xH_yOH$ (alcohols). Alternatively large cluster ions may be employed.

Preferably, the second polarity ions should have a mass/charge ratio of at least 400.

In a preferred example, the method includes applying an external electric field to a region of the ion beam and introducing said second polarity ions in said region. As explained previously, beam neutralisation problems arise especially in regions of external electric field.

Then said second polarity ions are accelerated by said external electric field in a field gradient direction, and said second polarity ions may be introduced at a location in said region which is upstream relative to said field gradient direction.

It is normal practice in ion beam machines where a positive ion beam is accelerated or decelerated between a first electrode at a first potential and a second electrode at a second higher potential, to provide an electron suppression electrode between the first and second electrodes at a potential which is more negative than that of the first electrode, to prevent electrons being drawn from the beam beyond the first electrode by the influence of the potential on the second electrode. Then, for such a positive ion beam, ions of negative polarity are preferably introduced adjacent to the electron suppression electrode.

The invention also provides apparatus for neutralising space charge in an ion beam, comprising means producing a beam of ions of a first polarity, means generating ions of a second polarity, and means introducing said second polarity ions to space charge neutralise the ion beam.

Examples of the present invention will now be described with reference to the accompanying drawing which is a schematic illustration of an ion source for positive ions with an extraction arrangement incorporating an example of the present invention.

Referring to the FIGURE, an ion source comprises an arc chamber 10 which may be configured as a Bernas source, or any other known ion source. A feed gas, here shown as $BF_3$ is supplied to the arc chamber along a pipe 11 and the arc chamber operates to create a plasma within the arc chamber in which are formed the ions $B^+$ and $BF_2^+$, for example. These positive ions are then extracted from the arc chamber via an exit aperture 12 to form a beam. In the described example, the source is providing a beam of boron ions (or $BF_2$ ions) which may be useful for implanting a silicon substrate with boron. However, other ions may be produced where required, such as $As^+$, $P^+$ or $Ar^+$, for example.

The ions are extracted from the arc chamber 10 by the electric fields produced by electrodes 13 and 14. To extract positive ions from the source, the arc chamber 10 and in particular the front face 15 containing the exit aperture 12 is held at a positive potential relative to the electrodes 13 and 14. In practice, the electrode 14 may form the entrance aperture to a mass analysing magnet and will usually be at ground potential. The mass analysing magnet and a subsequent mass selection slit are used to select from the ions drawn from the arc chamber 10 ions of the precise mass required for implanting. For example, the mass analyser and mass selection slit may select only $B^+$ ions for onward transmission to the semiconductor substrate target. Neither the mass analyser magnet nor the subsequent elements of the beam path to the substrate target are illustrated in the drawing. These components may be typical of those customarily used in this art.

In order to ensure that ions entering the mass analyser magnet, passing through the electrode 14, have a well defined energy, the potential of the front face 15 of the arc chamber 10 is controlled by a power supply 16. In the illustrated example, power supply 16 applies a potential of about 2 kV or less to the front face, so that the energy of the beam in the mass analyser will be correspondingly 2 keV or less depending on the potential applied.

The electrode 13 constitutes an electron suppression electrode and is set by a power supply 17 at a negative potential relative to the electrode 14 so as to prevent electrons in the beam downstream of the electrode 14, in the direction of the arrow 18 from being drawn out of the beam by the positive potential on the arc chamber 10. In this way, space charge neutralisation within the analyser magnet, downstream of the electrode 14, is largely maintained.

In the described example, the potential on the suppression electrode 13 is about −200 volts, but suppression potentials of several kilovolts below the ground potential of the analyser magnet and electrode 14 may be used.

As can be seen in the drawing, a substantial electric field exists between the exit aperture 12 of the arc chamber and the suppression electrode 13, and also, though to a lesser extent, between the suppression electrode 13 and the ground electrode 14 at the entrance to the mass analyser. In these regions, any electrons in the beam have very short residence times due to their small mass and high mobility. As a result, space charge neutralisation by electrons in the beam in these regions is ineffective.

In the described example, a source of argon gas is supplied along a pipe 20 to expand in a chamber 21. The sudden expansion of the argon gas in the chamber 21, causes clusters of argon atoms to condense together, producing clusters each of at least 100 atoms and in appropriate conditions, up to 1000 atoms or more.

Within the chamber 21, a heated cathode, 22 emits electrons, which arc accelerated through a grid electrode 23. The cathode 22 is biased relative to the grid 23 by a power source 24 to produce electrons of low energy (below about 50 eV). The resulting "spray" of low energy electrons passing through the grid 23 ionises argon clusters within the chamber 21, forming negatively charged cluster ions. The cluster ions in the chamber 21 diffuse from the chamber through an aperture 25 immediately adjacent the electron suppression electrode 13.

The resulting flood of negatively charged cluster ions emerging from the aperture 25 assists in neutralising the space charge of the portion of the ion beam between the exit aperture 12 of the arc chamber 10 and the suppression electrode 13.

As explained previously, for total space charge neutralisation, the density in a particular region of the ion beam of positive ions should equal the density of negative cluster ions ($N_b = N_c$).

Further, $N_b = J_b/ev_b = N_c = J_c/ev_c$, where $J_b$ is the current density resulting from the positive beam ions, $v_b$ is the velocity of those ions in the beam, $J_c$ is the current density in the beam of negative cluster ions, and $v_c$ is their velocity.

If at a particular location in the beam, the energy of the required positive ions is equal to the energy of the negative cluster ions, $$m_b v_b^2 = m_c v_c^2,$$

where $m_b$ is the mass of the positive ions and $m_c$ is the mass of the cluster ions.

From the above, $J_b/J_c = v_b/v_c = \sqrt{(m_c/m_b)}$.

Cluster ions comprising between 200 and 300 argon atoms are typically formed in the chamber 21. However, taking a minimum of 100 atoms in a cluster ion, $m_c \geq 4000$ a.u. If the positive ion in the ion beam is $B^+$ (mass≈10.8), $m_c/m_b \approx 400$ and $J_b/J_c \approx 20$.

Thus, for full space charge neutralisation in the region of the beam where both the positive ions and the negative cluster ions have the same energy, the current of cluster ions in the beam, accelerated by the electric field towards the exit aperture 12 of the arc chamber 10, must be about one-twentieth of the beam current of boron ions from the arc chamber. For a typical boron beam current of 5 mA, this implies a cluster ion current of 0.25 mA.

In the Figure, a power supply 26 is illustrated connected to apply a negative bias to the cluster ion source relative to the electron suppression electrode 13. In fact, the cluster ion source may be held at the same potential as the suppression electrode 13, relying on any residual positive charge in the ion beam to draw cluster ions from the aperture 25 and into the beam. However, a small negative bias may additionally be applied to the cluster ion source to control the flow of cluster ions.

In the illustrated example, the cluster ion source is shown delivering cluster ions on the upstream side of the suppression electrode. Since the potential difference between the arc chamber 10 and the suppression electrode 13 is likely to be greater than that between the suppression electrode 13 and the grounded electrode 14, the problem of space charge suppression in this region is most severe, especially if it is desired to extract relatively high currents at low energy from the arc chamber 10. However, cluster ions may also be delivered on the other side of the suppression electrode 13 to neutralise space charge of the ion beam in the region between the suppression electrode 13 and the grounded electrode 14.

The example of the invention described above refers to a positive ion beam comprising boron ions. However, the invention is applicable equally to other desired positive ion beams. The invention may also be applied to beams of negative ions, in which case positive cluster ions are introduced. Positive cluster ions may be formed in the chamber 21 by spraying the condensed clusters of atoms with electrons of higher energy.

Further, the above examples describe using argon cluster ions. Other gases may be used which can be made to produce large clusters of atoms. For ion implantation purposes, the cluster ions should be of a species which can be tolerated in the implantation process. Further, for minimum mobility of the cluster ion in the electric field regions of the ion beam, relatively heavy atoms are preferred such as xenon.

Also, the above described example refers to neutralising the ion beam at the point of extraction from the arc chamber of the ion source. Examples of the invention may be used also at other regions of a beam where an external electric field renders the lifetime of any electrons in the beam extremely short so that space charge neutralisation becomes a problem. For example, negative cluster ion neutralisation may be employed in a region where the ion beam is accelerated, and more particularly decelerated, by means of an electric field prior to impact on a target.

Also cluster ions may be used to provide beam space charge neutralisation in a region where a beam is scanned transversely. In this case, the cluster ion neutralisation process described may be useful even if the beam scanning is conducted by magnetic fields, rather than electric fields. In such regions, self neutralisation of the ion beam, by the creation of electrons through collisions with residual gas atoms, may be insufficient to maintain adequate control of the beam potential. The beam may be scanned too rapidly to allow sufficient numbers of electrons to accumulate in the beam to provide adequate neutralisation. Flooding the scanning region with massive negative cluster ions should substantially improve beam neutralisation.

Ions of opposite polarity may also be used for neutralising an ion beam at other locations along the beam between the ion beam source and the ion beam process target. For example, such opposite polarity ions may be injected into the ion beam containing volume of a magnet used for mass analysis (or energy analysis) of the process ion beam. Improved beam neutralisation and control may then be achieved in the magnet, especially at low beam energies and high beam currents. Opposite polarity ions may also be used to neutralise an ion beam in so called drift regions of no electric or magnetic field. Examples of drift regions in an ion implanter are between the ion source extraction optics and the entrance to the mass analysis magnet, between the mass analysis magnet and the mass resolving system, and between a post mass selection acceleration (or deceleration) stage and a substrate neutralisation system.

The invention is not restricted to the use of cluster ions for neutralising the beam. Some improvement in beam control may be achieved with ions of the second polarity (negative ions for a positive ion beam). Even He has a mass 4 which is about $10^4$ times the rest mass of an electron (~$5.5 \times 10^{-4}$ a.u.), so that the current density of He$^-$ for the same neutralising effect is only one hundredth that for electrons. Generally, the second polarity ions should be of a species which will not have substantial deleterious effects in the process. More massive ions and cluster ions are preferred, especially for neutralising in regions of applied electric field.

What is claimed is:

1. A method of neutralising space charge in an ion beam comprising ions of a first polarity, the method comprising the steps of generating ions of a second polarity, and introducing said second polarity ions to space charge neutralise the ion beam, wherein an external electric field is applied to a region of the ion beam, and said second polarity ions are introduced in said region.

2. A method as claimed in claim 1, wherein said second polarity ions are accelerated by said external electric field in a field gradient direction and said second polarity ions are introduced at a location in said region which is upstream in said field gradient direction.

3. A method as claimed in claim 2, wherein said second polarity ions have negative polarity and are introduced adjacent to an electron suppression electrode in the beam extraction system of a source of positive ions.

4. A method as claimed in claim 1, wherein said second polarity ions are cluster ions.

5. A method as claimed in claim 4, wherein said cluster ions have a mass/charge ratio of at least 400.

6. A method as claimed in claim 1, wherein the ion beam comprises positive ions and said second polarity ions are negative.

7. Apparatus for neutralising space charge in an ion beam, comprising means producing a beam of ions of a first polarity, means applying an external electric field to a region of said beam, means generating ions of a second polarity, and means introducing said second polarity ions in said region to space charge neutralise the ion beam.

8. Apparatus for neutralising space charge in an ion beam, comprising a source of ions of a first polarity, said source producing a beam of said first polarity ions, electrodes to apply an external electric field to a region of said beam, a chamber in which ions of a second polarity are generated, and an aperture from said chamber adjacent to said region of said beam through which said second polarity ions diffuse into said region to space charge neutralise said beam.

9. A method of neutralising space charge in an ion beam comprising ions of a first polarity, the method comprising the steps of generating ions of a second polarity, and introducing said second polarity ions to space charge neutralise the ion beam, wherein said second polarity ions are cluster ions having a mass/charge ratio of at least 400.

10. A method as claimed in claim 9, including applying an external electric field to a region of the ion beam, wherein said second polarity cluster ions are introduced in said region.

11. Apparatus for neutralising space charge in an ion beam, comprising a source of ions of a first polarity, said source producing a beam of said first polarity ions, a chamber in which cluster ions of a second polarity are generated, said cluster ions having a mass/charge ratio of at least 400, and an aperture from said chamber adjacent to said beam through which said second polarity ions diffuse to space charge neutralise said beam.

12. A method of neutralising space charge in an ion beam comprising ions of a first polarity, the method comprising the steps of generating ions of a second polarity, and introducing said second polarity ions to space charge neutralise the ion beam, wherein an external magnetic field is applied to a region of the ion beam, and said second polarity ions are introduced in said region.

* * * * *